United States Patent
Cheng et al.

(10) Patent No.: US 8,653,599 B1
(45) Date of Patent: Feb. 18, 2014

(54) STRAINED SIGE NANOWIRE HAVING (111)-ORIENTED SIDEWALLS

(71) Applicant: International Business Machines Corporation, Armonk, NY (US)

(72) Inventors: Kangguo Cheng, Schenectady, NY (US); Bruce B. Doris, Brewster, NY (US); Ali Khakifirooz, Mountain View, CA (US); Alexander Reznicek, Troy, NY (US); Thomas N. Adam, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/679,222

(22) Filed: Nov. 16, 2012

(51) Int. Cl.
*H01L 27/12* (2006.01)

(52) U.S. Cl.
USPC .......................................... 257/351

(58) Field of Classification Search
USPC ........... 257/27, 213–413, 900, 902–903, 901, 257/642, 643; 977/707, 720, 721, 723, 742, 977/762, 809, 825, 855, 932, 938
See application file for complete search history.

(56) References Cited

U.S. PATENT DOCUMENTS

| | | | |
|---|---|---|---|
| 7,692,179 B2 | 4/2010 | Islam et al. | |
| 7,923,314 B2 | 4/2011 | Tezuka et al. | |
| 8,357,922 B2 * | 1/2013 | Hong et al. | 257/9 |
| 2008/0014821 A1 * | 1/2008 | Jiang et al. | 445/24 |
| 2008/0135949 A1 | 6/2008 | Lo et al. | |
| 2011/0233522 A1 | 9/2011 | Cohen et al. | |
| 2012/0007051 A1 | 1/2012 | Bangsaruntip et al. | |
| 2012/0138886 A1 | 6/2012 | Kuhn et al. | |

FOREIGN PATENT DOCUMENTS

| | | |
|---|---|---|
| CN | 102082096 A | 6/2011 |
| JP | 2011507231 A | 3/2011 |

* cited by examiner

*Primary Examiner* — Dao H Nguyen
*Assistant Examiner* — Tram H Nguyen
(74) *Attorney, Agent, or Firm* — Catherine Ivers; L. Jeffrey Kelly

(57) ABSTRACT

A CMOS nanowire FinFET device structure and method of manufacturing the same are provided. The CMOS nanowire FinFET device structure includes a first plurality of fins and a second plurality of fins. The first and the second plurality of fins are formed in a semiconductor-on-insulator (SOI) layer over a buried insulator (BOX) layer. The first plurality of fins is formed in the first region and the second plurality of fins is formed in the second region. The CMOS nanowire FinFET device structure further includes a first plurality of nanowires formed over a top surface of each of the first plurality of fins and containing a first epitaxial layer. The first plurality of nanowires has a pair of facet surfaces. The pair of facet surfaces has (111) crystal orientation.

25 Claims, 8 Drawing Sheets

STRAINED SIGE NANOWIRE HAVING (111)-ORIENTED SIDEWALLS

BACKGROUND

Field of the Invention

The present invention relates to nanoscale channel-based field effect transistors (FETs), such as FinFETs and nanowire FETs, and more particularly, to strained silicon germanium (SiGe) nanowires having (111)-oriented sidewalls.

Embedded silicon germanium (e-SiGe) sources and drains have been used successfully in bulk planar p-channel field effect transistors (PFETs) as an efficient method to induce compressive strain in the PFET channel. In general, a FET includes a source and a drain connected by at least one channel and a gate that regulates current flow through the channel(s). The compressive strain increases the hole mobility and therefore the device drive current of PFET.

The process used for e-SiGe sources and drains in bulk planar PFETs includes etching out the source and drain region of the PFET in silicon (Si) and then epitaxially growing a source and a drain region from SiGe. Due to the lattice mismatch between SiGe and Si (with SiGe having a large lattice constant), the source and drain regions induce a compressive strain in the PFET channel.

For further scaling of complimentary metal-oxide semiconductor (CMOS) technology, non-planar devices such as FinFETs and nanowire FETs exhibit superior short channel control than is achievable with planar bulk FETs. Unfortunately, it is not possible to use e-SiGe in its present known form to strain the FET channel in these non-planar devices. The main reason the e-SiGe process is not compatible with these non-planar FET geometries is that the channel is made up of a very thin body (such as a fin or a nanowire). Etching out the channel extensions in order to replace them with epitaxial SiGe is not possible since there is no substrate from which epitaxial SiGe can seed.

Maintaining mobility improvement and short channel control as microelectronic device dimensions scale past the 14 nm node provides a challenge in device fabrication. Accordingly, it would be desirable to maintain mobility improvement and short channel control as microelectronic device dimensions scale past the 14 nm node.

SUMMARY

In an aspect of the invention, a FinFET device structure includes a first plurality of fins having a pair of side surfaces and a top surface and a second plurality of fins having a pair of side surfaces and a top surface. The first and the second plurality of fins are formed in a semiconductor-on-insulator (SOI) layer over a buried insulator (BOX) layer. The first plurality of fins is formed in the first region and the second plurality of fins is formed in the second region. The FinFET device structure further includes a first plurality of nanowires formed over the top surface of each of the first plurality of fins and containing a first epitaxial layer. The first plurality of nanowires has a pair of facet surfaces. The pair of facet surfaces has (111) crystal orientation.

In another aspect of the invention, a method of forming a FinFET device structure includes providing a semiconductor-on-insulator (SOI) substrate having a first region and a second region. The SOI substrate has a SOI layer overlying a buried oxide (BOX) layer. The method further includes forming a first plurality of fins and a second plurality of fins in the SOI layer over the BOX layer. The first plurality of fins is formed in the first region and the second plurality of fins is formed in the second region. The method further includes forming a first plurality of nanowires in such a manner that each of the first plurality of nanowires has a pair of facet surfaces. The pair of facet surfaces has (111) crystal orientation.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION

An embodiment of the present invention relates to a structure and method of forming CMOS nanowire FinFET devices. Tri-gate field effect transistors (Tri-gate FETs) on silicon-on-insulator wafers provide the advantages of the FinFETs without requiring a relatively tall and thin fin. As long as the height of the fin is comparable to the thickness of the fin and as long as the fin is fully depleted, the three-dimensional field effects of a tri-gate FET will give improved short-channel characteristics over a tall fin of the same thickness. Strained SiGe channel is the most promising candidate for PFET performance boost as less and less area is available for eSiGe.

More specifically, an embodiment of the present invention comprises a FinFET device structure which includes a first plurality of fins having a pair of side surfaces and a top surface and a second plurality of fins having a pair of side surfaces and a top surface. The first and the second plurality of fins are formed in a semiconductor-on-insulator (SOI) layer over a buried insulator (BOX) layer. The first plurality of fins is formed in the first region and the second plurality of fins is formed in the second region. The FinFET device structure further includes a first plurality of nanowires formed over the top surface of each of the first plurality of fins and containing a first epitaxial layer. The first plurality of nanowires has a pair of facet surfaces. The pair of facet surfaces has (111) crystal orientation. According to an embodiment of the present invention, the plurality of nanowires may be formed from SiGe epitaxial layer. Advantageously, the structures of disclosed embodiments of the present invention are an improvement over prior art because they allow to retain the strain in nanowires even with relatively high Ge content. As discussed below, the embodiments of the present invention are applicable to a variety of substrates including Semiconductor-on-Insulator ("SOT"), Extremely Thin Semiconductor-on-Insulator ("ETSOI"), and the like.

Figure 1:
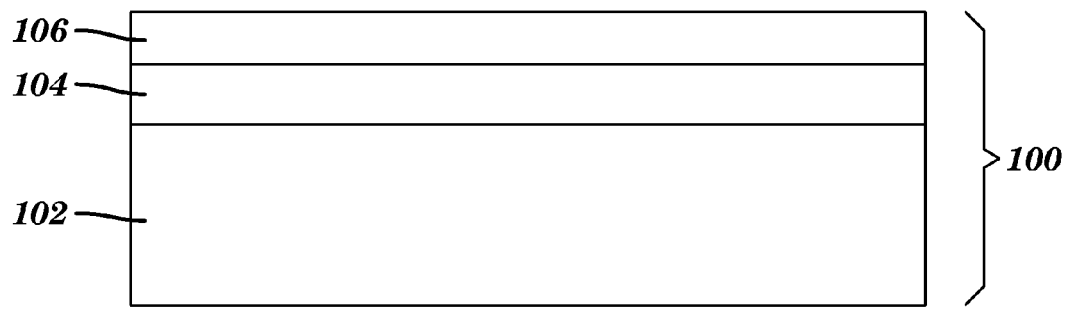
FIGS. 1 through 5 schematically illustrate method steps for fabrication of a CMOS nanowire FinFET device structure in accordance with an embodiment of the present invention.

FIGS. 1 through 5 schematically illustrate method steps for fabrication of a CMOS nanowire FinFET device structure using a tri-gate process flow in accordance with an embodiment of the present invention. Referring to FIG. 1, the method in accordance with this exemplary embodiment of the invention begins with providing a semiconductor layer 102 of the SOT structure 100. Semiconductor substrate 102 may be any type of wafers of suitable semiconductor material. Preferably, the initial substrate is a single crystal silicon wafer.

Still referring to FIG. 1, a buried insulator layer 104 is formed so as to cover semiconductor layer 102. Buried insulator layer 104 is preferably silicon dioxide ($SiO_2$) formed through a thermal oxidation process. Buried insulator layer 104 is commonly referred to as a buried oxide or "BOX" layer and will so be referred herein. Buried insulator layer 104 may be formed to a thickness of approximately 5-200 nm, and preferably approximately 20-150 nm.

After that, the silicon active layer of the SOT wafer may be formed by bonding upper semiconductor layer (referred to hereinafter as SOT layer) 106 to the buried insulator layer 104. A thickness of the SOT layer 106 may range between approximately 5 nm and approximately 50 nm, and preferably between approximately 10 nm and approximately 30 nm. Bonding may be performed in two stages. For example, in a first stage, the substrates are heated to approximately 600° C., in an inert environment for approximately three hours. The heating of the first stage causes bonding of the SOT layer 106 to the BOX layer 104 due to Van der Waals forces. In a second stage of the bonding process, the bonded structure is heated to approximately 1050-1200° C. for 30 minutes to two hours to strengthen the bond between the BOX layer 104 and the SOI layer 106. The BOX layer 104 isolates the SOI layer 106 from the semiconductor layer 102 below the BOX layer 104. The top surface of the SOI layer 106 is in the (100) crystallographic orientation.

Figure 2:
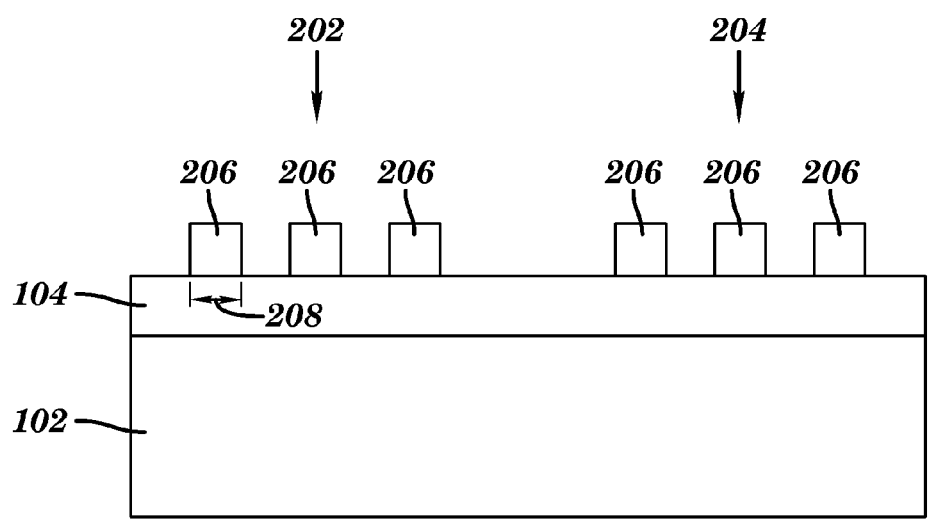

Referring to a cross-sectional view of FIG. 2 two SOI finFET devices, such as PFET and NFET of CMOS circuitry may be manufactured in two adjacent regions on the same semiconductor substrate. For example, as shown in FIG. 2, PFET may be fabricated in the first region (PFET region) 202 over the SOI substrate and NFET may be fabricated in the second region (NFET region) 204. Regions 202 and 204 may be adjacent to each other. Methods known in the art such as lithography, sidewall image transfer, or directional self-assembly can be used to define the patterns of the regions 202 and 204. The fabrication process may continue with selectively etching by, for example RIE (Reactive Ion Etching), the SOI layer 106 while leaving the pattern shown in FIG. 2. The SOI layer 106 may be etched, for example, by using a silicon nitride film as a mask. According to this embodiment, the BOX layer 104 acts as an etch stop layer. In this manner, the structure shown in FIG. 2 can be obtained. The structure shown in FIG. 2 includes a first plurality of relatively long island-like semiconductor portions, referred to hereinafter as fins 206, formed in the PFET region 202, while, as a non-limiting example, a similar pattern of the fins 206 may be formed in the second (NFET) region 204. An exemplary fin width 208 may range between approximately 5 nm and approximately 30 nm, and preferably between approximately 8 nm and approximately 15 nm. An exemplary height of each fin 206 is defined by the thickness of the SOI layer 106. It should be noted that the island-like structure of fins 206 is preferable to achieve uniaxial compressive strain in the PFET devices fabricated at the end of the process. Also, as shown in FIG. 2, in an embodiment of the present invention it may be preferred that the sidewalls of the fins 206, formed in the PFET region 202 and the NFET region 204, have a (110) crystallographic orientation.

Figure 3:
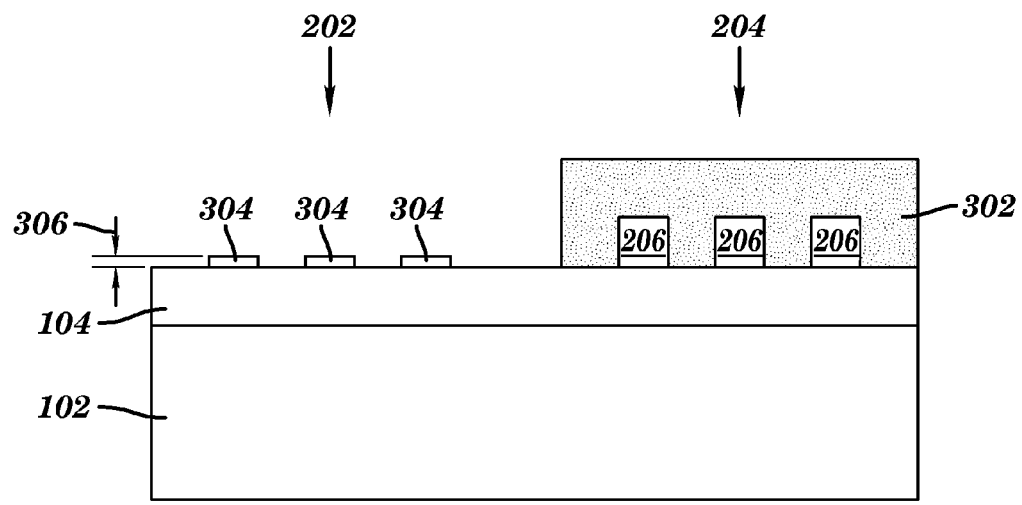

Referring now to FIG. 3, a mask 302, such as a silicon nitride ($Si_3N_4$) hardmask, may be formed over the NFET region 204. Next, the exposed fins which are not covered by the hardmask 302 in the PFET region 202 may be etched away by, for example, RIE down to a desired thickness. According to an embodiment of the present invention, the desired thickness 306 of the thinned down fins 304 in the PFET region 202 may range from approximately 2 nm to approximately 10 nm.

Figure 4A:
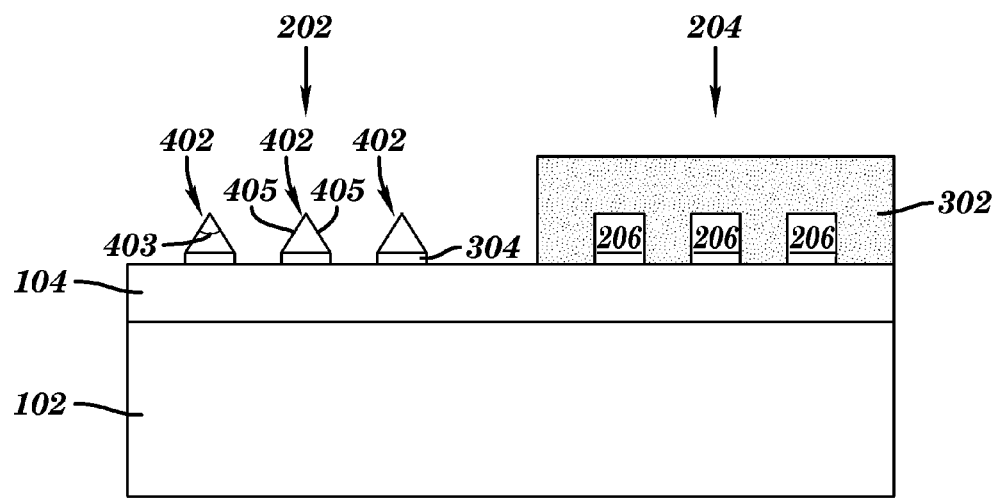

According to an embodiment of the present invention, FIG. 4A schematically illustrates next CMOS device fabrication stage, which may include the selective epitaxial growth process for forming a first plurality of nanowires. In an embodiment of the present invention, the first plurality of nanowires 402 may contain the strain inducing material such as, for example, SiGe and the like. This stage may include any appropriate process steps for preparing the thinned down fins 304 in the PFET region 202 for the selective epitaxial growth, which may include, for example, cleaning of the surfaces of the fins 206 in the 202 region to remove polymer contaminants from earlier process steps. During the selective epitaxial growth process, process parameters may be selected such that a self-limiting deposition behavior may be obtained, at least in one crystallographic orientation or axis. For example, according to an embodiment of the present invention, (111) crystal planes or any physically equivalent planes have substantially smaller epitaxial growth rate compared to (100) crystal planes, thereby providing a self-limiting deposition behavior once the deposited material forms a geometric configuration, in which (111) crystallographic planes are the only outer surface areas which may thus substantially completely prevent a further deposition of any further material. Thus, as shown in FIG. 4A, a plurality of nanowires 402 containing a strain-inducing material (SiGe) may be formed over the top surface of each of the plurality of thinned down fins 304 in the PFET region 202, wherein each of the first plurality of nanowires 402 have substantially triangular cross sectional profile having a top corner 403 equal to approximately 70°. In accordance with an embodiment of the present invention, each of the first plurality of nanowires 402 has a pair of facet surfaces 405 having (111) crystal orientation. In other words, the first plurality of nanowires 402 may have a substantially triangular prism configuration. Consequently, once the desirable geometrical configuration is achieved for the first plurality of nanowires 402, the deposition process may be stopped on the basis of the self-limiting behavior. The SiGe layer can be formed, for example, by a selective epitaxial process using a combination of Si containing gas, such as silane ($SiH_4$), dichlorosilane ($SiH_2Cl_2$), disilane ($Si_2H_6$), trisilane ($Si_3H_8$) or tetrasilane ($Si_4H_{10}$), a germanium containing gas, such as germane ($GeH_4$) or digermane ($Ge_2H_6$), a carrier gas such as nitrogen, hydrogen, or argon, and an optional etchant gas such as hydrogen chloride (HCl) or chlorine ($Cl_2$), at a temperature ranging preferably from approximately 450° C. to approximately 900° C. The SiGe layer may have a Ge concentration of approximately 15% to approximately 100%, and preferably from approximately 20% to approximately 60%. It should be noted that, in accordance with an embodiment of the present invention, the second plurality of fins 206 formed in the NFET region 204 may have a substantially rectangular prism configuration and thus may have a substantially rectangular cross sectional profile. The first plurality of nanowires 402 and the second plurality of fins 206 serve as the active regions of the channel in CMOS devices, such as a PFET device formed in the first region 202 and NFET device formed in the second region 204.

Figure 4B:
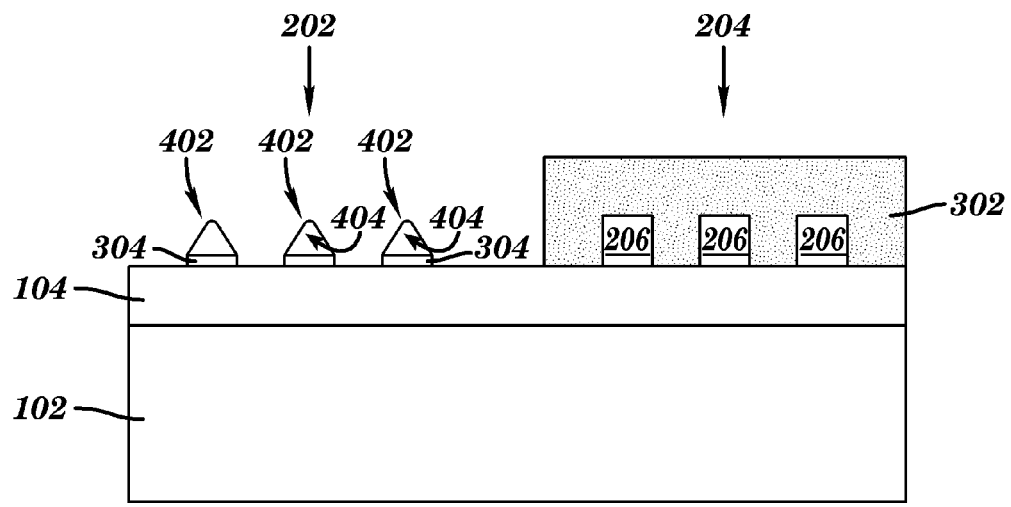

FIG. 4B illustrates an alternative embodiment, in which subsequent to achieving a substantially triangular prism configuration for the plurality of nanowires 402, an additional step of rounding the nanowire corners, such as the corner 403 shown in FIG. 4A, may be performed. According to this embodiment, the rounding of nanowire corners can be accomplished through use of a hydrogen anneal. In a hydrogen anneal step sharp edges of corners (i.e. corner 403), are softened by allowing reflow of atoms to form substantially rounded corners, such as corner 404 shown in FIG. 4B. The hydrogen anneal process used here may include: an $H_2$ ambient with a temperature of between approximately 700 degrees C. and approximately 1000 degrees C., for between approximately less than 1 minute and approximately 30 minutes, and at a pressure between approximately 10 Ton and approximately 1 atm. High temperature annealing allows microstructure transformation that minimizes surface energy by forming a rounded corner 404 in each of the plurality of nanowires 402. As depicted in FIG. 4B, the rounding of nanowire corners 404 can be performed in the PFET region 202, while the NFET region is covered by the hard mask 302.

Figure 5:
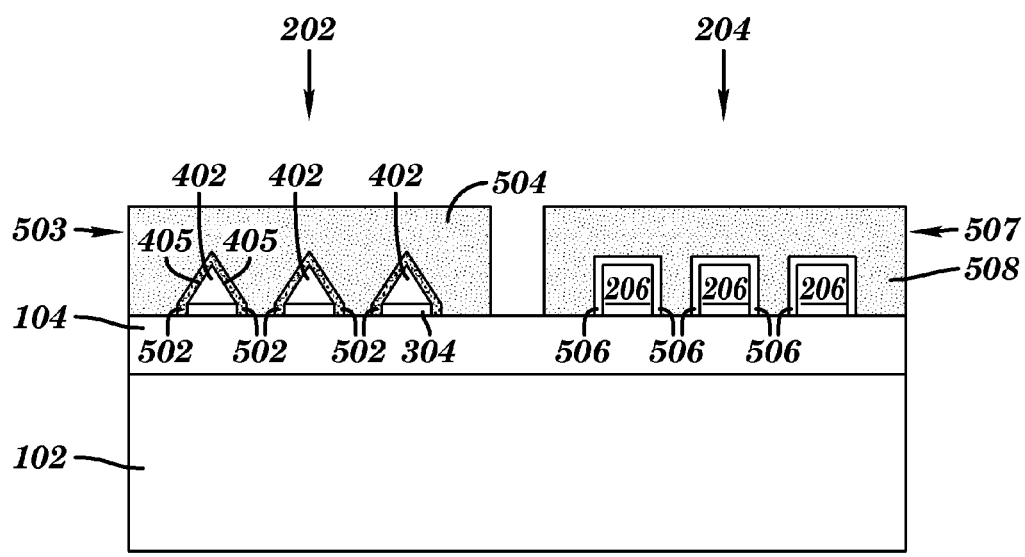

Once the desirable configuration for the plurality of nanowires 402 is obtained in the PFET region 202, the process may continue with removal of the hard mask 302 and conventional process flow for CMOSFET device formation. As shown in FIG. 5, gates 503 and 507 may be formed in the PFET region 202 and the NFET region 204, respectively. FIG. 5 shows that first gate 503 includes two layers, that is a first gate dielectric layer 502 and a first gate electrode layer 504.

The first gate dielectric layer 502 can be any suitable dielectric material. For example, the first gate dielectric 502 can be a thermal oxide layer or a thermal nitride layer that is formed through thermal oxidation or thermal nitridation. Alternatively, the first gate dielectric layer 502 can comprise at least one of: a transition metal oxide, such as tantalum oxide ($Ta_2O_5$), titanium oxide ($TiO_2$), zirconium oxide ($ZrO_2$), hafnium oxide ($HfO_2$), gadolinium oxide ($Ga_2O_3$), scandium oxide ($Sc_2O_3$), a silicate alloy, such as zirconium silicate alloy or hafnium silicate alloy, or a complex oxide, such as gadolinium scandium oxide ($GdScO_3$), dysprosium oxide ($DyScO_3$) or hafnium titanium oxide ($HfTiO_4$), and other dielectrics. The first gate dielectric 502 can be conformaly deposited on the pair of facet surfaces 405 of each of the first plurality of nanowires 402 and conformaly deposited on a pair of side surfaces of each of the first plurality of fins 304 by, for example, chemical vapor deposition (CVD) techniques or atomic layer deposition (ALD) techniques.

The first gate electrode 504 can then be stacked on the first gate dielectric layer 502. The first gate electrode layer 504 can be formed of any conductive materials, such as a metal including copper, gold, platinum, palladium, aluminum, ruthenium, titanium or tantalum, a metal compound including tantalum carbide (TaC), tantalum nitride (TaN), tantalum silicon nitride (TaSiN), or a semiconductor material (i.e. polysilicon or polysilicon germanium), and the like. The deposition of the first gate electrode layer 504 over the gate dielectric layer 502 can be performed by physical vapor deposition (PVD) techniques, such as e-beam techniques or sputtering, CVD techniques, ALD techniques, or electroplating techniques.

As shown in FIG. 5, the second gate 507 can be formed in the NFET region 204. The second gate 507 includes two layers, that is a second gate dielectric layer 506 and a second gate electrode layer 508. Materials and processes that may be employed to form the second gate dielectric layer 506 and the second gate electrode layer 508 are substantially the same as the materials and processes described above in conjunction with fabrication of the first gate dielectric layer 502 and the first gate electrode layer 504.

Thus, an embodiment of the present invention described above relates to a structure and a method of forming nanowire FinFET CMOS devices on a SOI substrate. The CMOS device comprises a PFET device formed in the first region 202 and NFET device formed in the second region 204. The first and second regions, 202 and 204, respectively are adjacent regions of the SOI substrate. The CMOS device structure further includes a first gate 503 formed in the first region 202. The first gate 503 substantially surrounds a portion of each of the first plurality of nanowires 402. The first plurality of nanowires 402 serves as a plurality of channel regions in the PFET device formed in the first region 202. The CMOS device structure further includes a second gate 507 formed in the second region 204. The second gate 507 substantially surrounds a portion of each of the second plurality of fins 206. The second plurality of fins 206 serves as a plurality of channel regions in the NFET device formed in the second region 204. According to an embodiment of the present invention, the first plurality of nanowires 402 are formed by faceted epitaxial growth process. The first plurality of nanowires 402 have a substantially triangular prism configuration and thus, substantially triangular cross-section defined by (111) facet surfaces 405. Furthermore, the first plurality of nanowires are oriented such that (111) facet surfaces 405 intersect parallel to the long axis (shown in FIG. 13) of each nanowire 402. According to an embodiment of the present invention, the plurality of fins 206 have a substantially rectangular prism orientation. Advantageously, since the first plurality of nanowires 402 contain SiGe material and since the epitaxial growth of the first plurality of nanowires 402 is done in relatively small islands, the SiGe structure of the first plurality of nanowires 402 retains the strain even with relatively high Ge content. Moreover, in a CMOS nanowire FinFET structure, (111) surface orientation, advantageously, has higher hole mobility as compared to (100) surface orientation. Furthermore, the self-limiting epitaxy process described above that uses (111) facets of SiGe produces smooth and defect-free surface, further improving the device performance.

FIGS. 6 through 12 schematically illustrate method steps for fabrication of a CMOS nanowire FinFET structure in accordance with another embodiment of the present invention. This embodiment of the present invention is applicable to a fabrication of a CMOS nanowire FinFET structure using ETSOI substrate. Some of the device features, structures, and process steps are similar, identical, or equivalent to counterparts described above with reference to FIGS. 1-5. For the sake of brevity, common features, structures, and process steps will not be redundantly described in detail here with reference to FIGS. 6-12.

Figure 6:
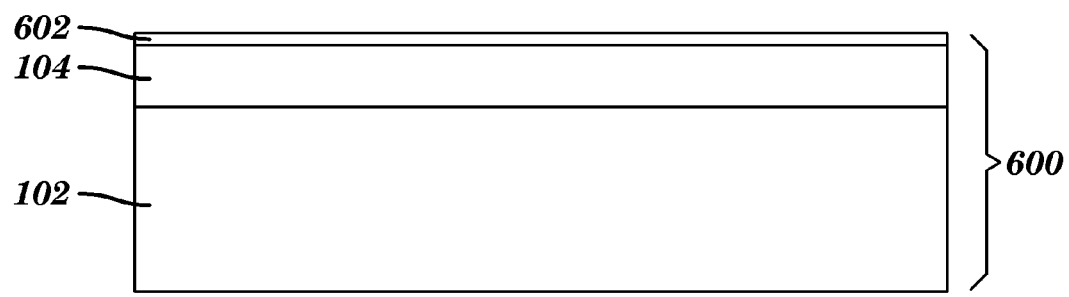
FIGS. 6 through 12 schematically illustrate method steps for fabrication of a CMOS nanowire FinFET structure in accordance with another embodiment of the present invention.

Referring to FIG. 6, the method in accordance with this exemplary embodiment of the invention begins with providing an extremely thin semiconductor layer 602 (hereafter referred to as ETSOI layer) of the ETSOI structure 600. The ETSOI structure 600 includes a BOX layer 104 formed so as to cover the semiconductor layer 102. The ETSOI layer 602 is in turn formed over the BOX layer 104. The ETSOI layer 602 may comprise any semiconducting material including, but not limited to Si, strained Si, Si:C, SiGe, SiGeC, Si alloys, Ge, Ge alloys, GaAs, InAs, and InP, or any combination thereof. The ETSOI layer 602 may be thinned to a desired thickness by planarization, grinding, wet etch, dry etch, oxidation followed by oxide etch, or any combination thereof. One method of thinning the ETSOI layer 602 is to oxidize the Si by a thermal dry or wet oxidation process, and then wet etch the oxide layer using a hydrofluoric acid mixture. This process can be repeated to achieve the desired thickness. In one embodiment, the ETSOI layer 602 has a thickness ranging from about 1.0 nm to about 20.0 nm. In another embodiment, the ETSOI layer 602 has a thickness ranging from about 1.0 nm to about 5.0 nm. In a further embodiment, the ETSOI layer 602 has a thickness ranging from about 3.0 nm to about 8.0 nm.

Figure 7:
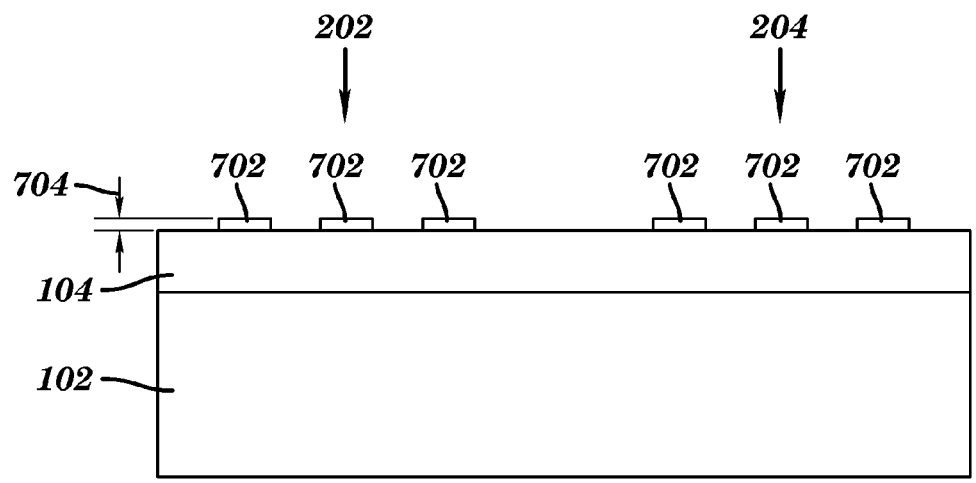

Turning to FIG. 7, the method of fabrication continues with selectively etching a pattern by, for example, RIE in the ETSOI layer 602 while leaving the pattern shown in FIG. 7. It should be noted that first plurality of fins (island-like or convex semiconductor portions) 702 is formed in the first (PFET) region 202, while, as a non-limiting example, a similar pattern of the fins 702 is formed in the second (NFET) region 204. The ETSOI layer 602 may be etched, for example, by using a silicon nitride film as a mask and conventional processes, such as lithography, sidewall image transfer, directional self-assembly or any other technique suited to define the patterns. According to this embodiment, the BOX layer 104 acts as an etch stop layer. In this manner, the structure shown in FIG. 7 can be obtained. An exemplary height 704 of each fin 702 is defined by the thickness of the ETSOI layer 602.

Figure 8:
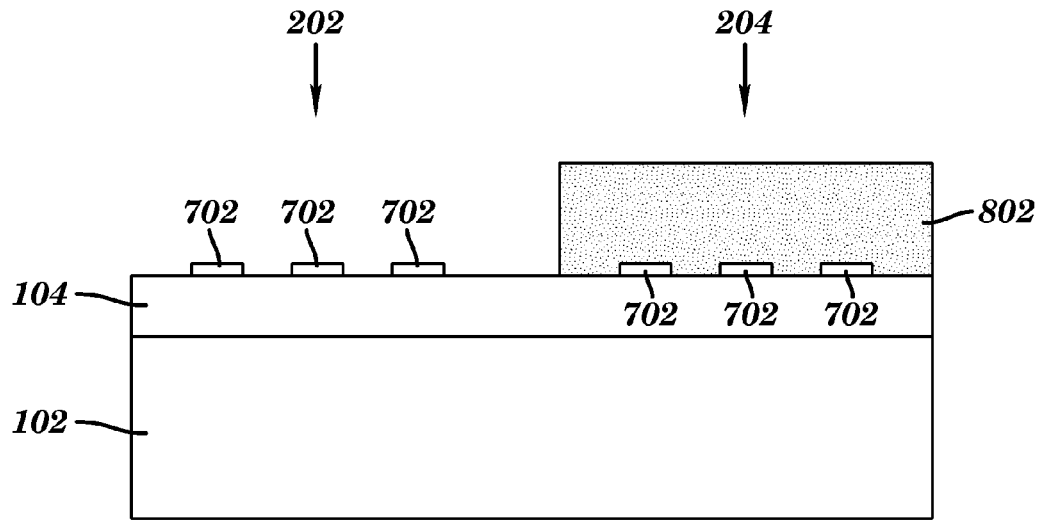
Figure 9:
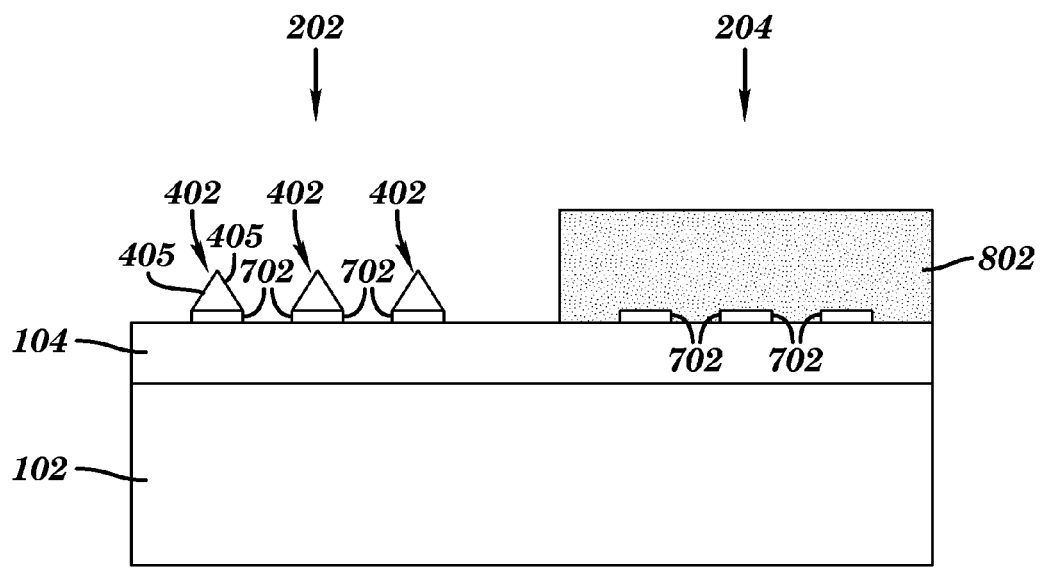

Referring now to FIG. 8, a mask 802, such as a silicon nitride ($Si_3N_4$) hardmask, may be formed over the NFET region 204. Next, as illustrated in FIG. 9, the first plurality of nanowires 402 is formed by epitaxially growing layer of strain inducing semiconductor material, for example, but not limited to silicon germanium material, over the top surface of each of the first plurality of fins 702 in the first region 202, as described above in conjunction with FIG. 4A. It should be noted that the first plurality of nanowires 402 has a substantially triangular prism configuration and thus, substantially triangular cross-section defined by facet surfaces 405 having (111) crystal orientation.

Figure 10:
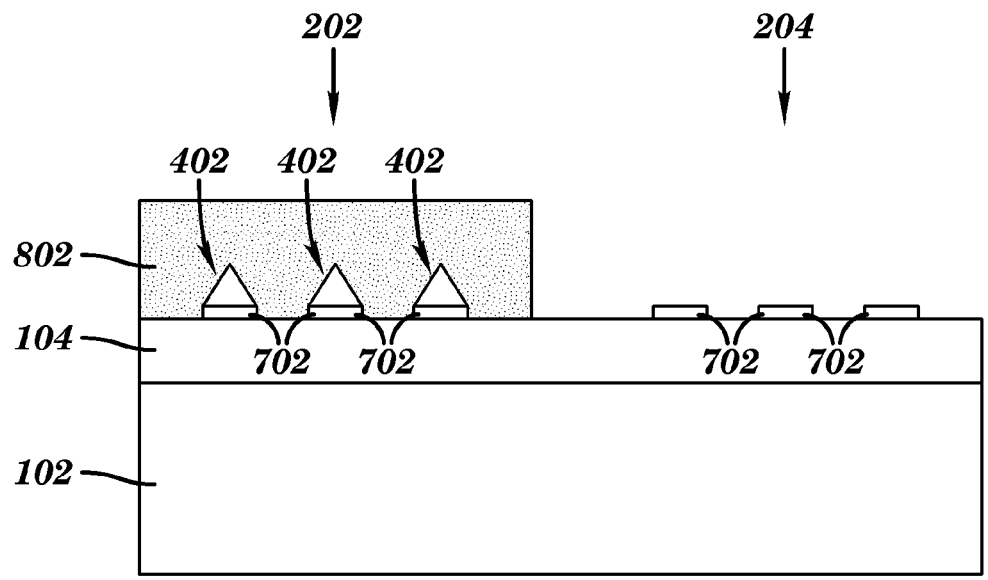
Figure 11A:
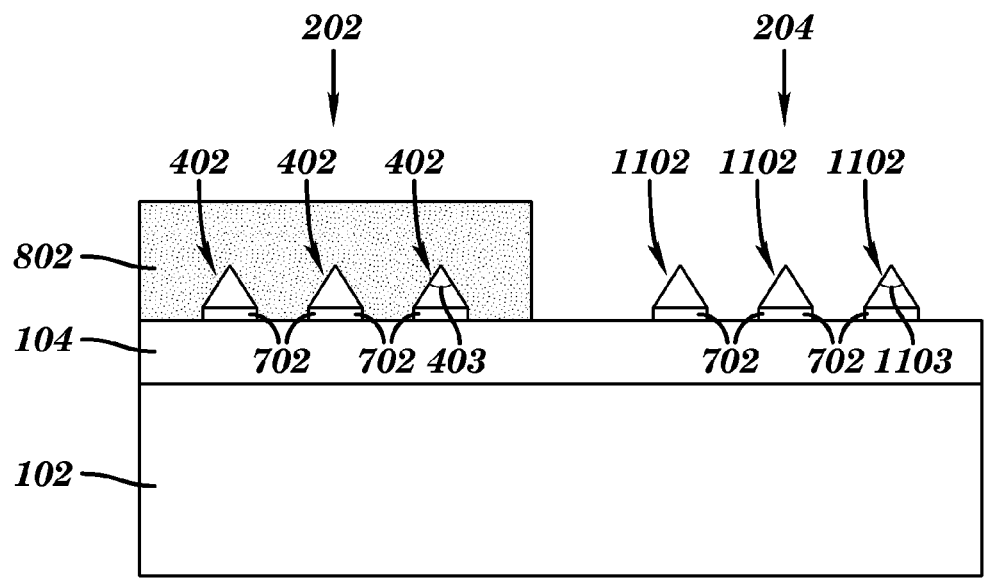

Referring now to FIG. 10, after the formation of the first plurality of nanowires 402 in the PFET region 202, the hardmask 802, may be removed from the NFET region 204 and another hard mask may be formed to cover the PFET region 202 next. Referring now to FIG. 11A, the second plurality of nanowires 1102 may be formed above top surface of each of the second plurality of fins 702 in the NFET region 204 using selective epitaxial growth process, described above in conjunction with FIG. 4A, or a cyclical deposition-etch process. However, in this case a second epitaxial layer containing, for example, but not limited to carbon doped silicon (Si:C) (with carbon concentration ranging between approximately 0.2% and approximately 4%) is grown instead of the first epitaxial layer containing SiGe, by using a combination of Si containing gas, such as silane ($SiH_4$), dichlorosilane ($SiH_2Cl_2$), disilane ($Si_2H_6$), trisilane ($Si_3H_8$) or tetrasilane ($Si_4H_{10}$), a carbon containing gas such as monomethylsilane, dimethylsilane, or trimethylsilane, an etchant gas such as hydrogen chloride (HCl) or chlorine ($Cl_2$), and a carrier gas such as nitrogen, argon, hydrogen, or a mixture of those, at a temperature ranging between approximately 500° C. and approximately 900° C. In a preferred exemplary embodiment, the concentration of carbon (C) in the second epitaxial layer may range between approximately 1.5% and approximately 2.2%. It should be noted, the second plurality of nanowires 1102 follows the configuration (i.e. substantially triangular prism configuration) of the first plurality of nanowires 402 and Si:C provides a tensile strain. Once the desirable geometrical configuration is achieved for the second plurality of nanowires 1102, the deposition process may be stopped on the basis of the self-limiting growth behavior. Each of the first plurality of nanowires 402 and each of the second plurality of nanowires 1102 have substantially triangular cross sectional profile having a top corner 403 and 1103, respectively, equal to approximately 70°.

Figure 11B:
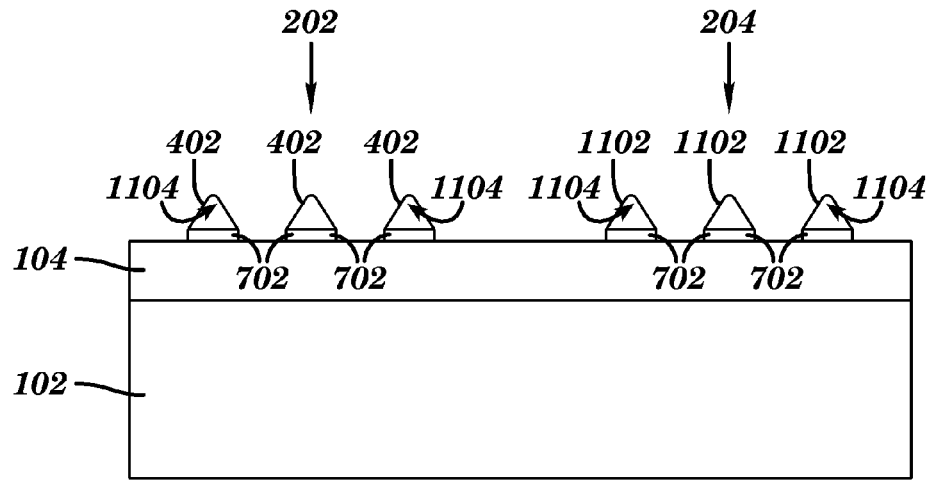

FIG. 11B illustrates an alternative embodiment, in which subsequent to achieving a substantially triangular prism configuration for the first plurality 402 and the second plurality 1102 of nanowires, an additional step of rounding the nanowire corners, such as the corners 403 and 1103 shown in FIG. 11A, may be performed. According to this embodiment, the rounding of nanowire corners 1104 depicted in FIG. 11B can be accomplished through use of a hydrogen anneal described above in conjunction with FIG. 4B. Thus, in a hydrogen anneal step sharp edges of corners, such as corners 403 and 1103, are softened by densification to form substantially rounded corners, such as corners 1104 shown in FIG. 11B.

Figure 12:
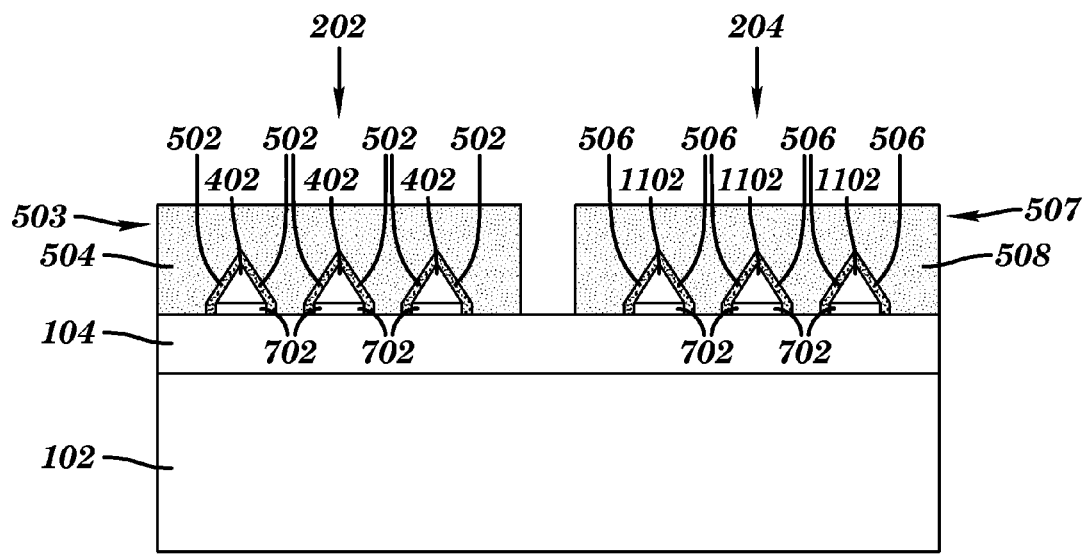

Once the desirable configuration for the first plurality of nanowires 402 and the second plurality of nanowires 1102 is obtained, the process may continue with the conventional process flow for CMOSFET device formation. As shown in FIG. 12, a first gate 503 and a second gate 507 may be formed in the PFET region 202 and the NFET region 204, respectively, as described above in conjunction with FIG. 5. FIG. 12 shows that the first gate 503 includes two layers, that is a first gate dielectric layer 502 and a first gate electrode layer 504 and the second gate 507 includes a second gate dielectric layer 506 and a second gate electrode layer 508. After the first gate 503 and second gate 507 structures are formed, conventional CMOS FinFET fabrication processing can be utilized to complete the transistors (e.g. forming the source/drain regions, contacts, interconnects and inter-level dielectrics for the corresponding FinFET devices.

Thus, the embodiment of the present invention described above in conjunction with FIGS. 6-12 relates to a structure and a method of forming nanowire FinFET CMOS devices on a ETSOI substrate. The fabrication method described in this embodiment advantageously eliminates the step of forming thinned down fins, as described above in conjunction with FIG. 3. In addition, both the first plurality of nanowires 402 and the second plurality of nanowires 1102 have the same triangular prism configuration, thereby simplifying the processing steps of forming gate, spacer, and source and drain junctions. Furthermore, in this embodiment, the (111) sidewalls of the second plurality of nanowires 1102, formed by the self-limiting epitaxy in the NFET region 204, are smoother as compared to the (110) sidewalls of the fins 206 obtained using RIE process, as shown for example, in FIG. 2. Moreover, at high electric fields, (111) surface orientation, advantageously, has higher electron mobility when compared to (110) orientation.

Figure 13:
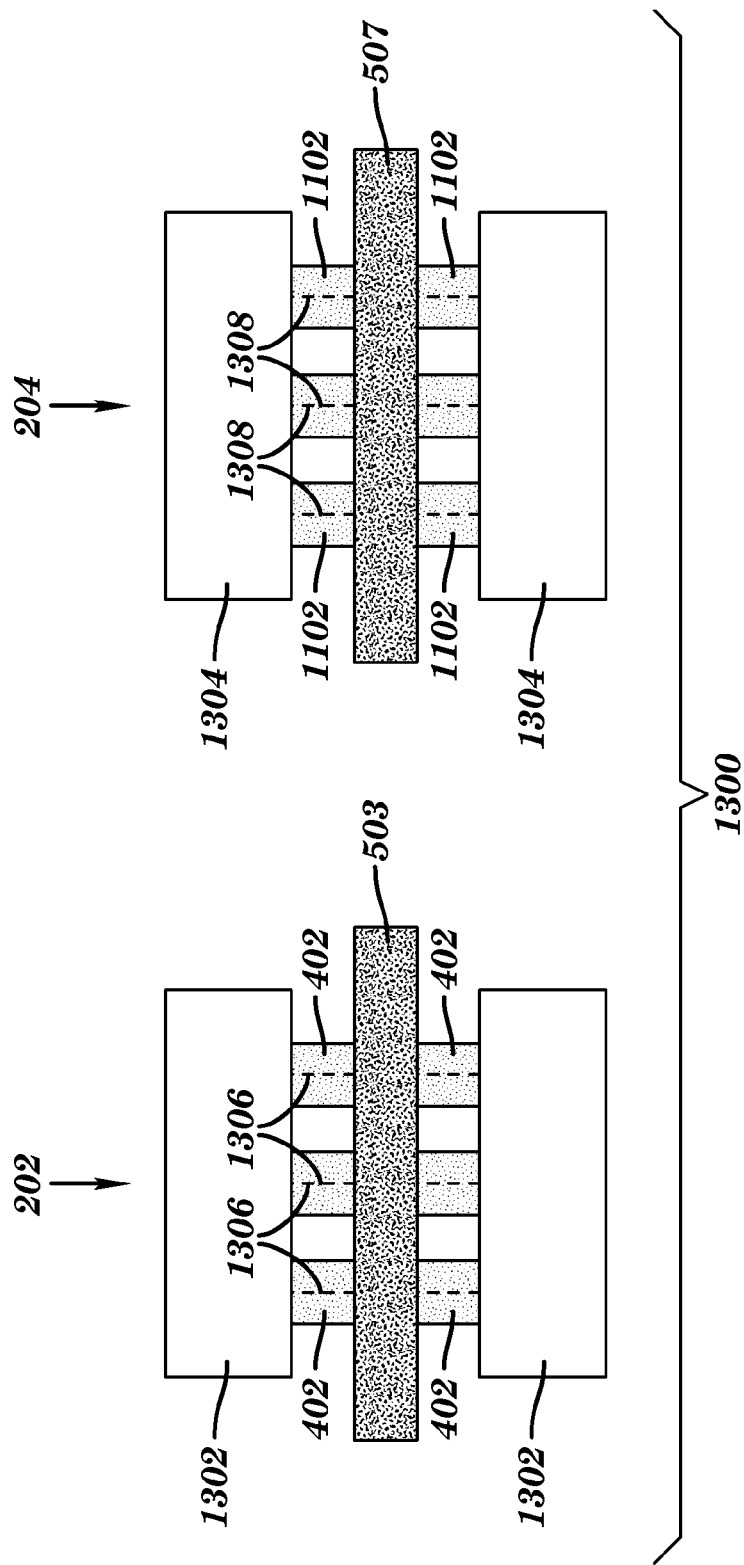
FIG. 13 schematically illustrates an exemplary top view of the CMOS nanowire FinFET device structure 1300 consistent with the principles of the embodiments of the invention after the source/drain regions and gates are formed.

FIG. 13 schematically illustrates an exemplary top view of the CMOS nanowire FinFET device structure 1300 consistent with the principles of the previously described embodiments of the invention after the source/drain regions and gates are formed. As illustrated, the CMOS device 1300 includes a PFET device formed in the PFET region 202 and a NFET device formed in the NFET region 204. As illustrated, the PFET device structure includes a first pair of source/drain regions 1302 and the first gate 503 arranged substantially perpendicular to the first plurality of nanowires 402. Each of the first plurality of nanowires 402 contacts the source on one end and the drain on the other. The first pair of source/drain regions 1302 may then be doped with p-type impurities. Examples of p-type impurities include, but are not limited to, boron, aluminium, gallium and indium. Activation annealing may then be performed to activate the source/drain regions 1302. As previously indicated, the first plurality of nanowires 402 have substantially triangular prism configuration. FIG. 13 illustrates that the long axis 1306 of each of the first plurality of nanowires 402 are aligned substantially parallel to each other. Furthermore, the first plurality of nanowires 402 are oriented such that facet surfaces of each nanowire 402 intersect parallel to the long axis 1306 of each nanowire 402.

Similarly, as illustrated in FIG. 13, the NFET device structure formed in the NFET region 204 includes a second pair of source/drain regions 1304 and a second gate 507 arranged substantially perpendicular to the second plurality of nanowires 1102. Each of the second plurality of nanowires 1102 contacts the source on one end and the drain on the other. The second pair of source/drain regions 1304 may then be doped with n-type impurities, such as, for example, phosphorus (P) or arsenic (As). Dopants may be incorporated into the second pair of source/drain regions 1304 by, for example, in-situ doping. The percentage of phosphorous or arsenic may range from approximately $1*10^{18}$ cm$^{-3}$ to approximately $2*10^{21}$ cm$^{-3}$, preferably from approximately $2*10^{20}$ cm$^{-3}$ to approximately $7*10^{20}$ cm$^{-3}$. According to an embodiment of the present invention, the second plurality of nanowires 1102 may also have substantially triangular prism configuration and may be oriented such that (111) facets of each nanowire 1102 intersect parallel to the long axis 1308 of each nanowire 1102. According to an alternative embodiment, the second plurality of nanowires 1102 may have a substantially rectangular prism configuration.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A FinFET device structure comprising:
    a first plurality of fins having a pair of side surfaces and a top surface and a second plurality of fins having a pair of side surfaces and a top surface, the first and the second plurality of fins formed in a semiconductor-on-insulator (SOI) layer over a buried insulator (BOX) layer, wherein the first plurality of fins is formed in a first region and the second plurality of fins is formed in a second region; and
    a first plurality of nanowires formed over the top surface of each of the first plurality of fins comprising a first epitaxial layer, wherein the first plurality of nanowires has a pair of facet surfaces, wherein the pair of facet surfaces has (111) crystal orientation.

2. The FinFET device structure of claim 1, wherein the first region comprises a p-type field effect transistor (PFET) region and the second region comprises an n-type field effect transistor (NFET) region.

3. The FinFET device structure of claim 1, wherein the first epitaxial layer comprises a silicon-germanium (SiGe) epitaxial layer.

4. The FinFET device structure of claim 1, wherein each of the first plurality of nanowires have substantially triangular cross sectional profile having a top corner.

5. The FinFET device structure of claim 4, wherein the top corner of the substantially triangular cross sectional profile is a substantially rounded corner.

6. The FinFET device structure of claim 1, wherein the second plurality of fins have substantially rectangular cross sectional profile.

7. The FinFET device structure of claim 1, wherein a width of each of the first plurality of fins ranges from approximately 8 nm to approximately 15 nm.

8. The FinFET device structure of claim 6, further comprising:
    a first gate formed over the BOX layer in the first region overlying a portion of the first plurality of nanowires; and
    a second gate formed over the BOX layer in the second region overlying a portion of the second plurality of fins.

9. The FinFET device structure of claim 8, wherein the first gate comprises a first dielectric layer conformaly deposited on the pair of facet surfaces of each of the first plurality of nanowires and on the pair of side surfaces of each of the first plurality of fins and a first gate electrode layer overlying the first dielectric layer in the first region and wherein the second gate comprises a second dielectric layer conformaly deposited over the second plurality of fins and a second gate electrode layer overlying the second dielectric layer in the second region.

10. The FinFET device structure of claim 1, wherein the first region is substantially adjacent to the second region.

11. The FinFET device structure of claim 1, wherein the SOI layer has a thickness of less than 10 nanometers.

12. The FinFET device structure of claim 11, wherein a height of each of the first plurality of fins and a height of each of the second plurality of fins are substantially equal to the thickness of the SOI layer.

13. The FinFET device structure of claim 12, further comprising a second epitaxial layer formed over the top surface of each of the second plurality of fins to form a second plurality of nanowires having a pair of facet surfaces, wherein the pair of facet surfaces has (111) crystal orientation.

14. The FinFET device structure of claim 13, wherein the second epitaxial layer comprises a silicon-carbide (SiC) epitaxial layer.

15. The FinFET device structure of claim 13, wherein each of the first plurality of nanowires and each of the second plurality of nanowires have substantially triangular cross sectional profile having a top corner.

16. The FinFET device structure of claim 15, wherein the top corner of the substantially triangular cross sectional profile is a substantially rounded corner.

17. A method of forming a FinFET device structure comprising:
    providing a semiconductor-on-insulator (SOI) substrate having a first region and a second region, the SOI substrate having a SOI layer over a buried oxide (BOX) layer;

forming a first plurality of fins having a pair of side surfaces and a top surface and a second plurality of fins in the SOI layer over the BOX layer, wherein the first plurality of fins is formed in the first region and the second plurality of fins is formed in the second region; and forming a first plurality of nanowires in such a manner that each of the first plurality of nanowires has a pair of facet surfaces, wherein the pair of facet surfaces has (111) crystal orientation.

18. The method of claim 17, wherein forming the first plurality of nanowires comprises performing a selective epitaxial growth process of a first epitaxial layer over the top surface of each of the first plurality of fins, the selective epitaxial growth process having a self-limiting deposition behavior in (111) crystal surface.

19. The method of claim 18, wherein the first epitaxial layer comprises a silicon-germanium (SiGe) epitaxial layer.

20. The method of claim 17, wherein forming the first plurality of fins and the second plurality of fins comprises selectively etching the SOI layer and wherein the selective etching produces the second plurality of fins substantially taller than the first plurality of fins.

21. The method of claim 17, wherein each of the first plurality of nanowires have substantially triangular cross sectional profile having a top corner.

22. The method of claim 21, further comprising performing an anneal using hydrogen gas to round the top corner of the substantially triangular cross sectional profile of each of the first plurality of nanowires.

23. The method of claim 17, further comprising:
forming a first gate over the BOX layer in the first region in such a manner that the first gate overlies a portion of the first plurality of nanowires; and forming a second gate over the BOX layer in the second region in such a manner that the second gate overlies a portion of the second plurality of nanowires.

24. The method of claim 17, wherein the SOI substrate comprises the SOI layer having a thickness of less than 10 nanometers.

25. The method of claim 24, wherein forming the first plurality of fins and the second plurality of fins comprises selectively etching the SOI layer and wherein the selective etching produces the second plurality of fins having a height substantially equal to a height of each of the first plurality of fins.

* * * * *